United States Patent [19]

Saraceni

[11] Patent Number: 5,153,985
[45] Date of Patent: Oct. 13, 1992

[54] METHOD OF ASSEMBLY FOR THE APPLICATION OF ELECTRONIC COMPONENTS TO FLEXIBLE PRINTED CIRCUITS

[76] Inventor: Maurizio Saraceni, Via Vasari, 59, 60027-Osimo (An), Italy

[21] Appl. No.: 729,323

[22] Filed: Jul. 12, 1991

[30] Foreign Application Priority Data

Sep. 3, 1990 [IT] Italy ............ 630 A/90

[51] Int. Cl.⁵ .................. H05K 3/30; B23P 19/00
[52] U.S. Cl. ............................ 29/834; 29/740; 29/840; 228/180.2
[58] Field of Search ........... 29/829, 740, 840, 834; 228/180.2

[56] References Cited

U.S. PATENT DOCUMENTS

| | | | |
|---|---|---|---|
| 3,614,832 | 10/1971 | Chance et al. | 228/180.2 |
| 3,724,068 | 4/1973 | Galli | 29/740 X |
| 3,859,723 | 1/1975 | Hamer et al. | 29/740 X |
| 3,887,996 | 6/1975 | Hartleroad et al. | 29/740 X |
| 4,237,607 | 12/1980 | Ohno | 29/840 |
| 4,667,402 | 5/1987 | Wilde | 29/840 |
| 4,724,611 | 2/1988 | Hagihara | 29/840 |
| 4,829,664 | 5/1989 | Kabeshita et al. | 29/740 X |
| 4,941,255 | 7/1990 | Bull | 29/740 X |

*Primary Examiner*—Carl J. Arbes
*Attorney, Agent, or Firm*—Leonard Bloom

[57] ABSTRACT

A method of assembling electronic components to a flexible printed circuit in which a component supporting plate is formed of a rigid plastic material with fitted recesses in which the electronic components are seated. The flexible printed circuit is overlayed with an elastomeric pad, and the flexible printed circuit and pad are then sandwiched between the component supporting plate and a counterplate which is similarly made of a rigid plastic material. This presses the conductors of the flexible printed circuit against the contacts of the electronic components seated in the fitted recesses of the aforesaid counterplate.

14 Claims, 1 Drawing Sheet

METHOD OF ASSEMBLY FOR THE APPLICATION OF ELECTRONIC COMPONENTS TO FLEXIBLE PRINTED CIRCUITS

BACKGROUND OF THE INVENTION

1. Field of the Invention

The present invention relates to flexible printed circuits, and more particularly to a method of assembly electronic components to a flexible printed circuit board.

2. Description of the Background

It is recognized in the art that a flexible printed circuit is a series of serigraphed conductors using conductor paste on a thin sheet of flexible backing usually made of a film of plastic material, such as, for example, polystyrene, polyamide, or ethylene resin.

The assembly of the electronic components on these flexible printed circuits presents numerous difficulties; the welding methods traditionally used on rigid printed circuits cannot be used with flexible printed circuits in that the conductor paste, because of its very nature and composition, cannot be welded to the connections of the components.

At present, conductor bonding agents are used which, once they reach their polymerization temperature, are able to guarantee a reliable and strong connection. However, this assembly technique requires time and its costs are high.

In addition, the resulting adherence of the conductor to the supporting flexible film is rather weak and precarious, so it is easy for an accidental break to occur between the parts, especially if the film is bent near the connection point of a component.

In order to avoid this risk and to increase the reliability of assembly, the electronic component and its connection could be encapsulated by covering them with a high bond rigid resin, but this would mean a further cycle in the oven with a consequent increase in time and production costs.

SUMMARY OF THE INVENTION

It is, therefore, an object of the present invention to provide a method of assembling a conventional electronic component such as, for example, resistors, condensers, LEDs, diodes, IC chips, etc., to a flexible printed circuit.

It is another object of this invention to resolve the above-described inconveniences by providing a new assembly method which is capable of guaranteeing maximum reliability with regard to the stability of the connections.

It is a further object of the invention to provide a new assembly method which is cable of reducing the time and cost of the assembly operation.

The assembly method according to the claims includes seating an electronic component in a fitted recess formed in a rigid plastic supporting plate, overlaying one side of a flexible printed circuit with the supporting plate such that the conductive terminals of the component are aligned with the flexible printed circuit, overlying another side of the flexible printed circuit with an elastomeric pad, and compressing the pad between the supporting plate and a counterplate to bias the conductive terminals of the component into conductive contact with the flexible printed circuit. The counterplate is then fastened to the supporting plate to maintain the conductive contact of the conductive terminals of the component with the flexible printed circuit.

The apparatus for practicing the method is also provided, the apparatus comprising a component supporting plate having a fitted recess formed in one side for seating the electronic component and for aligning conductive terminals of the component with one side of a flexible printed circuit, an elastomeric pad for overlaying the other side of the flexible printed circuit, and a counterplate for compressing the pad and the flexible circuit between the counterplate and component supporting plate. The counterplate is fastenable to the component supporting plate for maintaining the compression, and when the device is assembly, the conductive terminals of the component are biased into conductive contact with the flexible printed circuit.

The pad may be made of an elastomeric such as silicone, Neoprene TM or other synthetic rubber will be inserted which, correctly pressed will guarantee an efficient and reliable contact between the flexible printed circuit conductor and the electronic component even under adverse conditions as in the presence of vibration or knocks which, as is well known, are the most dangerous types of stress.

The elastic deformation of the soft pad also guarantees automatic compensation for any defects in flatness of the internal surfaces of the plate and counterplate between which the flexible printed circuit is sandwiched, and the opposing plates can even be sealed should such protection be required.

BRIEF DESCRIPTION OF THE DRAWINGS

Other objects, features, and advantages of the present invention will become more apparent from the following description of the invention with reference to the enclosed drawings which are simply illustrated and not limiting, in which.

DETAILED DESCRIPTION OF THE PREFERRED EMBODIMENT

Figure 1:
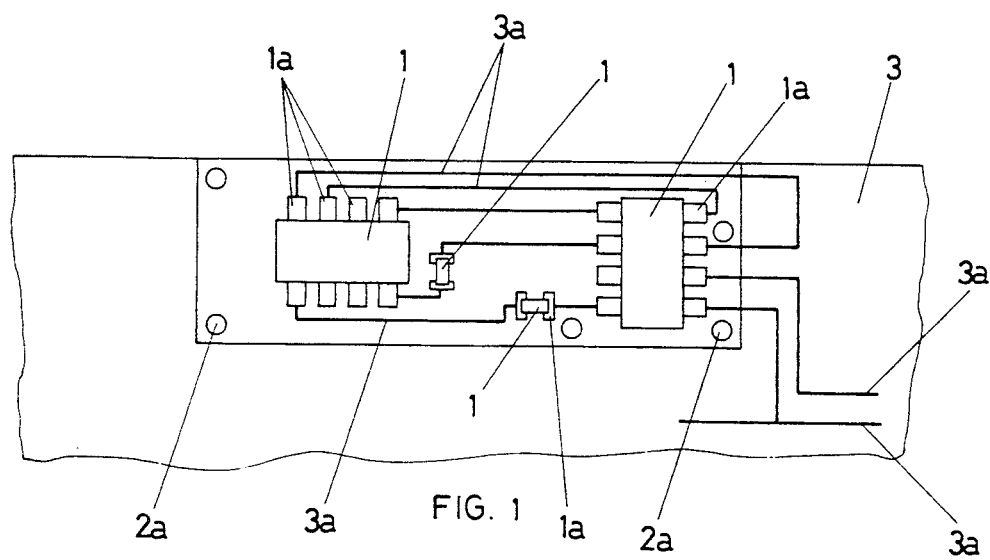
FIG. 1 shows a schematic plan drawing of a flexible printed circuit on which electronic components have been mounted using the assembly method of the present invention.
Figure 2:
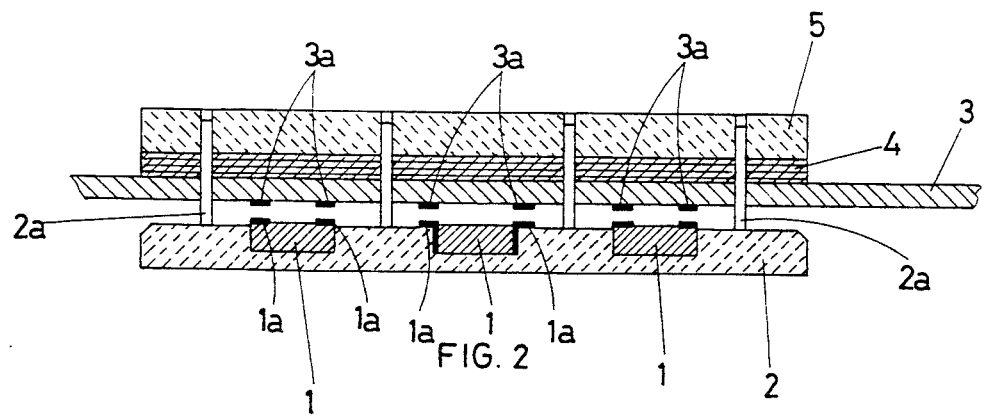
FIG. 2 shows a cross-section diagram of a flexible printed circuit on which the electronic components have been mounted using the assembly method of the present invention.

With reference to the aforesaid FIGS. 1 and 2, the assembly method according to the invention includes the following operative steps:

a) placing of electronic components (1) into fitted recesses which are formed in a surface of a supporting plate (2), the supporting plate and recesses being stamped out of a rigid plastic material;

b) positioning of a flexible printed circuit (3) against the plate (2) so that the conductors (3a) of the flexible printed circuit (3) are facing the plate (2);

c) laying of an elastomer pad (4) on the flexible printed circuit (3);

d) Compressing pad (4) between the plate (2) and a counterplate cover (5), the counterplate cover (5) having also been stamped out of rigid plastic material. The counterplate cover (5) is then fixed, using conventional fastening means, to the component supporting plate (2) to maintain the compression.

For example, in the preferred embodiment, the component supporting plate (2) is furnished with reference pins (2a) in order to align the conductors (3a) of the flexible printed circuit with the contacts (1a) of the components (1).

The same pins (2a) penetrate the intervening pad (4) and extend into the counterplate cover (5), and may likewise be used as centering elements for the pad (4) and counterplate (5).

The counterplate cover (5) may be fastened to the component supporting plate (2) using conventional screws, or as shown in FIG. 1, by extending the points of pins (2a) through counterplate cover (5) and riveting the extending points of pins (2a).

Having now fully set forth the preferred embodiments and certain modifications of the concept underlying the present invention, various other embodiments as well as certain variations and modifications of the embodiment herein shown and described will obviously occur to those skilled in the art upon becoming familiar with said underlying concept. It is to be understood, therefore, that within the scope of the appended claims, the invention may be practiced otherwise than as specifically set forth herein.

I claim:

1. A method for assembling an electronic component on a flexible printed circuit, comprising the steps of:
    seating said electronic component is a fitted recess formed in a rigid plastic supporting plate, the component having conductive terminals opposite the supporting plate;
    overlaying one side of a flexible printed circuit with said supporting plate such that the conductive terminals of said component are aligned with said flexible printed circuit;
    overlying another side of said flexible printed circuit with an elastomeric pad;
    compressing said pad between the supporting plate and a counterplate to bias the conductive terminals of said component into conductive contact with said flexible printed circuit; and
    fastening said counterplate to the supporting plate to maintain the conductive contact of the conductive terminals of said component with said flexible printed circuit.

2. The method according to claim 1, wherein said elastmeric pad comprises synthetic rubber.

3. The method according to claim 1, wherein said elastomeric pad comprises Neoprene TM.

4. The method according to claim 1, wherein said supporting plate is provided with reference pins and said flexible printed circuit is provided with corresponding holes to align the conductive terminals of the component with the flexible printed circuit.

5. The method according to claim 4, wherein said step of fastening said counterplate to the supporting plate further comprises screwing said counterplate to the supporting plate.

6. The method according to claim 4, wherein said counterplate is also provided with holes for receiving said reference pins.

7. The method according to claim 6, wherein said step of fastening said counterplate to the supporting plate further comprises riveting said counterplate to the supporting plate by said reference pins.

8. An apparatus for assembling electronic components to a flexible printed circuit board, comprising:
    a component supporting plate having a fitted recess formed in one side for seating an electronic component and for aligning conductive terminals of said component with one side of a flexible printed circuit;
    an elastomeric pad for overlaying another side of said flexible printed circuit;
    a counterplate for compressing said pad and said flexible circuit between said counterplate and component supporting plate, said counterplate being fastenable to said component supporting plate for maintaining said compression;
    whereby the conductive terminals of said component are biased into conductive contact with said flexible printed circuit.

9. The apparatus according to claim 8, wherein said elastomeric pad comprises synthetic rubber.

10. The apparatus according to claim 8, wherein said elastomeric pad comprises Neoprene TM.

11. The apparatus according to claim 8, wherein said supporting plate is provided with reference pins and said flexible printed circuit is provided with corresponding holes to effect alignment of the conductive terminals of the component with the flexible printed circuit.

12. The apparatus according to claim 11, further comprising screws for anchoring said counterplate to the supporting plate.

13. The apparatus according to claim 11, wherein said counterplate is also provided with holes for receiving said reference pins.

14. The apparatus according to claim 13, wherein said component supporting plate may be riveted to said counterplate by said retaining pins.

* * * * *